United States Patent
Trapassi et al.

(10) Patent No.: US 9,806,510 B2
(45) Date of Patent: Oct. 31, 2017

(54) CABLE GUIDE

(71) Applicant: Ortronics, Inc., New London, CT (US)

(72) Inventors: Domenic Trapassi, Cranston, RI (US); Chris M. Vacca, Westerly, RI (US)

(73) Assignee: Ortronics, Inc., New London, CT (US)

( * ) Notice: Subject to any disclaimer, the term of this patent is extended or adjusted under 35 U.S.C. 154(b) by 0 days.

(21) Appl. No.: 15/065,056

(22) Filed: Mar. 9, 2016

(65) Prior Publication Data

US 2017/0207615 A1    Jul. 20, 2017

Related U.S. Application Data

(60) Provisional application No. 62/280,822, filed on Jan. 20, 2016.

(51) Int. Cl.
*F16L 5/00* (2006.01)
*H02G 3/22* (2006.01)
(Continued)

(52) U.S. Cl.
CPC .............. *H02G 3/22* (2013.01); *F16L 5/00* (2013.01); *H02G 15/007* (2013.01);
(Continued)

(58) Field of Classification Search
CPC ........ H02G 3/22; H02G 3/083; H02G 3/0616; H02G 15/007; H02G 15/013; H01B 17/583; H01B 17/26; F16L 5/00; B60R 16/0222; H01R 13/5205; H05K 7/186
USPC ............ 248/56, 49, 62, 68.1, 74.1; 174/151, 174/153 G, 152 R, 153 R, 152 G, 650, 174/664, 665, 668, 669; 277/507, 606, 277/626, 637, 925; 16/2.1
See application file for complete search history.

(56) References Cited

U.S. PATENT DOCUMENTS 1,904,681 A * 4/1933 Frantz .................. F16L 5/00
126/317
2,367,836 A * 1/1945 Brown .................. B65H 57/06
16/2.1

(Continued)

OTHER PUBLICATIONS

U.S. Appl. No. 62/280,822, filed Jan. 20, 2016.

*Primary Examiner* — Leslie A Nicholson, III
*Assistant Examiner* — Taylor Morris
(74) *Attorney, Agent, or Firm* — McCarter & English, LLP

(57) ABSTRACT

Improved cable guide assemblies and related methods of use are provided. The present disclosure provides improved cable guide assemblies configured to support media cables, and related methods of use. More particularly, the present disclosure provides advantageous systems/methods for the design and use of cable bundle pass-through guide assemblies configured to support media cables associated with a rack or the like. The exemplary cable guide assembly includes attachment features/structures that are advantageously configured and dimensioned to releasably mount with respect to a supporting structure. In general, the cable guide assembly provides a smooth surface with bend relief for fiber or copper cables to pass through the sidewall or panel of an open rack system. The cable guide assembly can include first and second guiding members that are mounted to one another and to a first side of a sidewall/panel of an open rack to form a bisected ring-like structure.

6 Claims, 9 Drawing Sheets

(51) Int. Cl.
    *H05K 7/18*         (2006.01)
    *H02G 15/007*    (2006.01)
    *F16L 3/00*          (2006.01)
    *E21F 17/02*       (2006.01)
    *F16L 3/22*          (2006.01)
    *F16L 3/08*          (2006.01)
    *F16L 3/12*          (2006.01)
    *H01B 7/00*         (2006.01)
    *H01B 17/26*       (2006.01)
    *H01B 17/58*       (2006.01)
    *H02G 3/18*         (2006.01)
    *F16J 15/00*       (2006.01)
    *F16L 17/00*       (2006.01)
    *F16J 15/02*       (2006.01)
    *H01R 13/52*      (2006.01)
    *H02G 3/06*         (2006.01)
    *H02G 3/08*         (2006.01)
    *H02G 15/013*    (2006.01)

(52) U.S. Cl.
    CPC .......... *H05K 7/186* (2013.01); *H01R 13/5205* (2013.01); *H02G 3/0616* (2013.01); *H02G 3/083* (2013.01); *H02G 15/013* (2013.01)

(56) References Cited

U.S. PATENT DOCUMENTS

| | | | | |
|---|---|---|---|---|
| 2,518,851 A * | 8/1950 | Anderson | F16L 5/00 | 16/2.1 |
| 3,001,007 A * | 9/1961 | Klumpp, Jr. | H02G 3/0616 | 16/2.1 |
| 3,161,906 A * | 12/1964 | Yarm | H02G 3/0616 | 16/2.1 |
| 3,518,359 A * | 6/1970 | Trimble | B29C 57/00 | 16/2.2 |
| 3,562,847 A * | 2/1971 | Jemison | F16L 5/00 | 16/2.1 |
| 3,964,549 A * | 6/1976 | McGill | A62C 37/10 | 126/317 |
| 4,179,319 A * | 12/1979 | Lofdahl | B29C 61/0608 | 156/78 |
| 4,912,287 A * | 3/1990 | Ono | H02G 3/083 | 174/153 G |
| 5,537,714 A * | 7/1996 | Lynch, Jr. | B60R 16/0222 | 16/2.1 |
| 5,627,342 A * | 5/1997 | Kramer | H02G 3/083 | 174/152 G |
| 5,639,993 A * | 6/1997 | Ideno | B60R 16/0222 | 174/153 G |
| 6,051,795 A * | 4/2000 | Fisher | H02G 3/081 | 16/2.1 |
| 6,070,928 A * | 6/2000 | Campbell | B60R 13/0275 | 174/152 G |
| 6,119,305 A * | 9/2000 | Loveall | F16L 5/10 | 16/2.2 |
| 7,615,714 B2 * | 11/2009 | Pyron | H02G 3/22 | 174/660 |
| 7,645,946 B2 * | 1/2010 | Smith | F16L 5/02 | 174/650 |
| 7,983,038 B2 | 7/2011 | Levesque et al. | | |
| 8,106,311 B2 | 1/2012 | Larsen et al. | | |
| 8,130,494 B2 | 3/2012 | Larsen et al. | | |
| 8,374,664 B2 * | 2/2013 | Oyama | H01R 4/68 | 505/163 |
| 8,526,181 B2 | 9/2013 | Levesque et al. | | |
| 8,661,614 B2 * | 3/2014 | Allen | A61L 2/26 | 16/2.1 |
| 8,731,364 B2 | 5/2014 | Murano et al. | | |
| 2008/0190053 A1 * | 8/2008 | Surowiecki | H02G 3/083 | 52/220.8 |
| 2009/0129014 A1 | 5/2009 | Larsen et al. | | |
| 2013/0037319 A1 * | 2/2013 | Feiner | H02G 3/22 | 174/650 |
| 2014/0206273 A1 | 7/2014 | Larsen et al. | | |
| 2015/0214703 A1 | 7/2015 | Larsen et al. | | |
| 2015/0380920 A1 * | 12/2015 | Natoli | H02G 3/0616 | 277/606 |

\* cited by examiner

CABLE GUIDE

CROSS-REFERENCE TO RELATED APPLICATIONS

This application claims the benefit of U.S. Provisional application entitled "Cable Guide," which was filed on Jan. 20, 2016, and assigned Ser. No. 62/280,822, the contents of which are herein incorporated by reference in their entirety.

FIELD OF THE DISCLOSURE

The present disclosure relates to cable guide assemblies configured to support media cables and, more particularly to the design and use of cable bundle pass-through guide assemblies configured to support media cables associated with a rack or the like.

BACKGROUND OF THE DISCLOSURE

In general, many data transfer media includes multiple lines/fibers bundled together. Communications systems typically incorporate such media (e.g., unshielded twisted pair cables/media, fiber optic cables, etc.) for data transfer. In general, commercial buildings require an effective and efficient telecommunications infrastructure to support the wide variety of services that rely on the transport of information. Typically, wiring/cabling systems within buildings are terminated at a location where they may be interconnected with one another, and/or to other cabling systems or telecommunications equipment. Cables are often terminated on wire panels or patch panels or the like, which can be mounted to racks or to some other location/structure.

Many rows of cabinets or racks typically fill a data center or telecommunications room. In general, many of the cables associated with such cabinets/racks need to travel from the front of the cabinets/racks to the rear of the cabinets/racks. Many of these cables travel between adjacent racks from the front of the racks to the rear of the racks, and such cables may be unsupported and/or insufficiently supported during this travel from the front to the rear of the racks.

Some exemplary assemblies/systems in this general field are described and disclosed in U.S. Pat. Nos. 7,983,038; 8,106,311; 8,130,494; 8,526,181 and 8,731,364, and U.S. Patent Pub. No. 2009/0129014, and U.S. patent application Ser. Nos. 14/163,552 and 14/221,835, the entire contents of each being hereby incorporated by reference in their entireties.

A constant need exists among manufacturers to develop racks or associated devices or the like having improved supporting features/structures to support media cables associated with the racks. Thus, an interest exists for improved structures/features configured to support media cables, and related methods of use. These and other inefficiencies and opportunities for improvement are addressed and/or overcome by the assemblies, systems and methods of the present disclosure.

SUMMARY OF THE DISCLOSURE

The present disclosure provides advantageous cable guide assemblies, and improved methods/systems for using the same. The present disclosure provides advantageous cable guide assemblies configured to support media cables, and related methods of use. More particularly, the present disclosure provides improved systems/methods for the design and use of cable bundle pass-through guide assemblies configured to support media cables associated with a rack or the like.

In exemplary embodiments, disclosed herein is an advantageous cable guide assembly having at least first and second guiding members, the first and second guiding members configured and dimensioned to be mounted with respect to: (i) each other, and (ii) a supporting structure (e.g., rack) or the like (e.g., relative to vent holes of a rack). The mounted first and second guiding members define a pass-through opening having a flange-shaped surface that is configured and dimensioned to support and/or at least partially house media cables or the like. The exemplary cable guide assembly includes attachment features/structures (e.g., attachment members) that are advantageously configured and dimensioned to releasably mount with respect to the supporting structure.

In general, the cable guide assembly provides a smooth surface with bend relief for fiber or copper cables to pass through the sidewall or panel of an open rack system.

In certain embodiments, the cable guide assembly can include first and second guiding members that are mounted to one another and to a first side of a sidewall/panel of an open rack to form a bisected ring-like structure.

In other embodiments, the cable guide assembly includes first, second, third and fourth guiding members, and with the first and second guiding members mounted to one another and to a first side of a sidewall/panel of an open rack, and with the third and fourth guiding members mounted to one another and to a second side of the sidewall/panel of the open rack to form a substantially ring-like or bagel-shaped cable guide assembly.

Thus, first and second guiding members are configured to mount independently to the first (or second) side of a sidewall/panel of an open rack (e.g., by mechanically snapping directly to a geometric shaped cutout in the sidewall/panel), and the third and fourth guiding members are configured to mount independently to the second (or first) side of the sidewall/panel of an open rack. The advantageous cable guide assembly can therefore provide for multiple mounting options around the sidewall/cutout depending on the desired mounting structure (e.g., utilizing first and second guiding members to provide a bisected ring-like structure; or utilizing first, second, third and fourth guiding members to provide a substantially ring-like or bagel-shaped cable guide assembly.

The present disclosure provides for a cable guide assembly including a first guiding member having a first receiving member, a first protruding member, and a first attachment member; a second guiding member having a second receiving member, a second protruding member, and a second attachment member; wherein the first and second guiding members are configured and dimensioned to be mounted with respect to: (i) each other with the first receiving member mating with the second protruding member and the second receiving member mating with the first protruding member, and (ii) a supporting structure with the first attachment member releasably securing to a first edge of an aperture of the supporting structure and the second attachment member releasably securing to a second edge of the aperture; and wherein the mounted first and second guiding members form a bisected ring-shaped structure having an opening bounded by a surface that is configured to support and at least partially house media cables.

The present disclosure also provides for a cable guide assembly wherein the supporting structure is a rack, and wherein the aperture of the supporting structure has a substantially polygonal shape.

The present disclosure also provides for a cable guide assembly wherein the first and second guiding members are each substantially half-circular in shape. The present disclosure also provides for a cable guide assembly wherein the first and second guiding members are each substantially arc-like in shape, and each curve about 180° around the opening to form the bisected ring-shaped structure.

The present disclosure also provides for a cable guide assembly wherein the aperture of the supporting structure has a substantially hexagonal shape. The present disclosure also provides for a cable guide assembly wherein the first and second attachment members each include an extending portion and a securing portion.

The present disclosure also provides for a cable guide assembly including a first guiding member having a first receiving member, a first protruding member, and a first attachment member; a second guiding member having a second receiving member, a second protruding member, and a second attachment member; a third guiding member having a third receiving member, a third protruding member, and a third attachment member; a fourth guiding member having a fourth receiving member, a fourth protruding member, and a fourth attachment member; wherein the first and second guiding members are configured and dimensioned to be mounted with respect to: (i) each other with the first receiving member mating with the second protruding member and the second receiving member mating with the first protruding member, and (ii) a supporting structure with the first attachment member releasably securing to a first edge of an aperture of the supporting structure and the second attachment member releasably securing to a second edge of the aperture; wherein the third and fourth guiding members are configured and dimensioned to be mounted with respect to: (i) each other with the third receiving member mating with the fourth protruding member and the fourth receiving member mating with the third protruding member, and (ii) the supporting structure with the third attachment member releasably securing to a third edge of the aperture of the supporting structure and the fourth attachment member releasably securing to a fourth edge of the aperture; and wherein the mounted first, second, third and fourth guiding members form a ring-shaped structure having an opening bounded by a surface that is configured to support and at least partially house media cables.

The present disclosure also provides for a cable guide assembly wherein the supporting structure is a rack, and wherein the aperture of the supporting structure has a substantially polygonal shape.

The present disclosure also provides for a cable guide assembly wherein the first, second, third and fourth guiding members are each substantially half-circular in shape. The present disclosure also provides for a cable guide assembly wherein the first guiding member includes a clearance slot that is configured to provide a clearance space for the third attachment member of the third guiding member so that the third attachment member of the third guiding member can be mounted to the supporting structure.

The present disclosure also provides for a cable guide assembly wherein the aperture of the supporting structure has a substantially hexagonal shape. The present disclosure also provides for a cable guide assembly wherein the first, second, third and fourth attachment members each include an extending portion and a securing portion.

The present disclosure also provides for a cable guide assembly wherein the first, second, third and fourth guiding members are each substantially arc-like in shape, and each curve about 180° around the opening to form the ring-shaped structure.

The present disclosure also provides for a cable guide assembly including a first guiding member having a first receiving member, a first protruding member, and a first attachment member; a second guiding member having a second receiving member, a second protruding member, and a second attachment member; a third guiding member having a third receiving member and a third protruding member; wherein the first, second and third guiding members are configured and dimensioned to be mounted with respect to: (i) each other with the first receiving member mating with the second protruding member and the second receiving member mating with the third protruding member and with the third receiving member mating with the first protruding member, and (ii) a supporting structure with the first attachment member releasably securing to a first edge of an aperture of the supporting structure and the second attachment member releasably securing to a second edge of the aperture; and wherein the mounted first, second and third guiding members form a bisected ring-shaped structure having an opening bounded by a surface that is configured to support and at least partially house media cables.

The present disclosure also provides for a cable guide assembly wherein the supporting structure is a rack, and wherein the aperture of the supporting structure has a substantially polygonal shape.

The present disclosure also provides for a cable guide assembly wherein the first, second and third guiding members are each substantially arc-like in shape, and each curve about 120° around the opening to form the ring-shaped structure.

The present disclosure also provides for a cable guide assembly wherein the aperture of the supporting structure has a substantially hexagonal shape. The present disclosure also provides for a cable guide assembly wherein the first and second attachment members each include an extending portion and a securing portion.

The present disclosure also provides for a cable guide assembly including a guiding member having first and second attachment members; wherein the guiding member is configured and dimensioned to be mounted with respect to a supporting structure with the first attachment member releasably securing to a first edge of an aperture of the supporting structure, and with the second attachment member releasably securing to a second edge of the aperture of the supporting structure; and wherein the mounted guiding member forms a bisected ring-shaped structure having an opening bounded by a surface that is configured to support and at least partially house media cables.

The present disclosure also provides for a cable guide assembly wherein the guiding member extends in a circular fashion from a first end to a second end, with the first and second ends being movable or flexible relative to one another to allow a user to flex or move the first or second end to facilitate mounting the guiding member to the supporting structure.

Any combination or permutation of embodiments is envisioned. Additional advantageous features, functions and applications of the disclosed systems, methods and assemblies of the present disclosure will be apparent from the description which follows, particularly when read in conjunction with the appended figures. All references listed in this disclosure are hereby incorporated by reference in their entireties.

BRIEF DESCRIPTION OF THE DRAWINGS

Features and aspects of embodiments are described below with reference to the accompanying drawings, in which elements are not necessarily depicted to scale.

Exemplary embodiments of the present disclosure are further described with reference to the appended figures. It is to be noted that the various features, steps and combinations of features/steps described below and illustrated in the figures can be arranged and organized differently to result in embodiments which are still within the scope of the present disclosure. To assist those of ordinary skill in the art in making and using the disclosed assemblies, systems and methods, reference is made to the appended figures, wherein.

DETAILED DESCRIPTION OF DISCLOSURE

Figure 1:
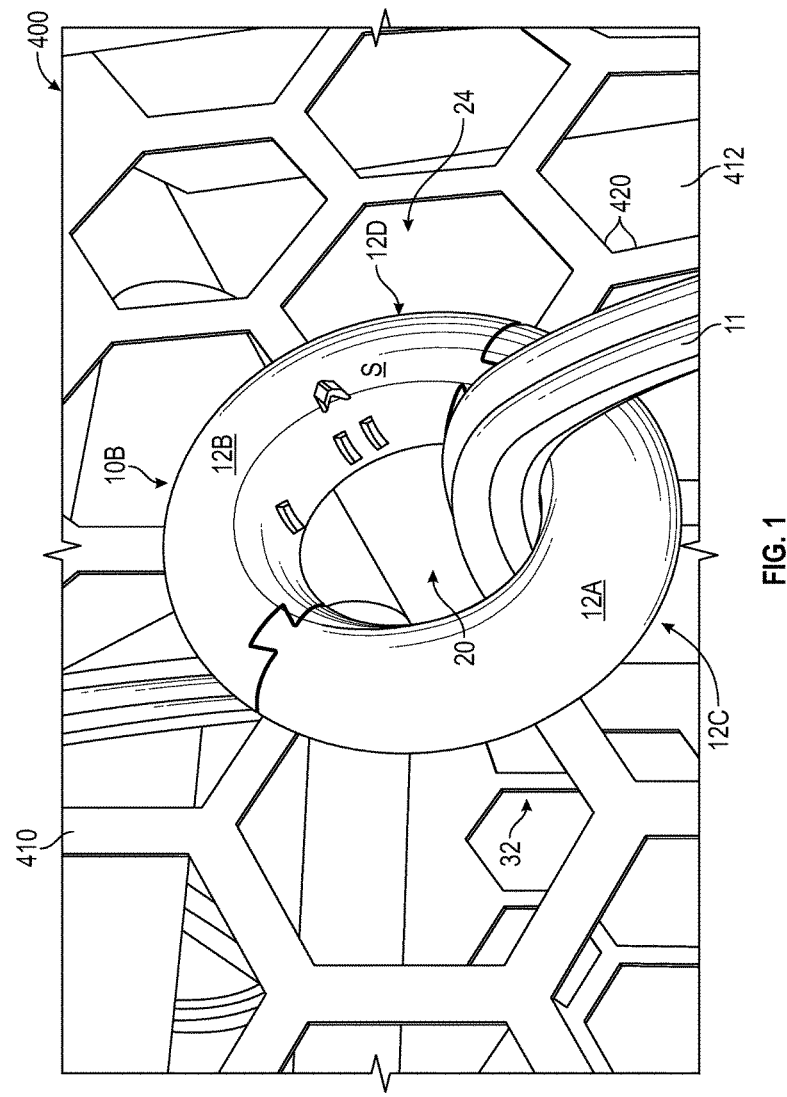
FIG. 1 is a front perspective view of an exemplary cable guide assembly of the present disclosure.
Figure 2:
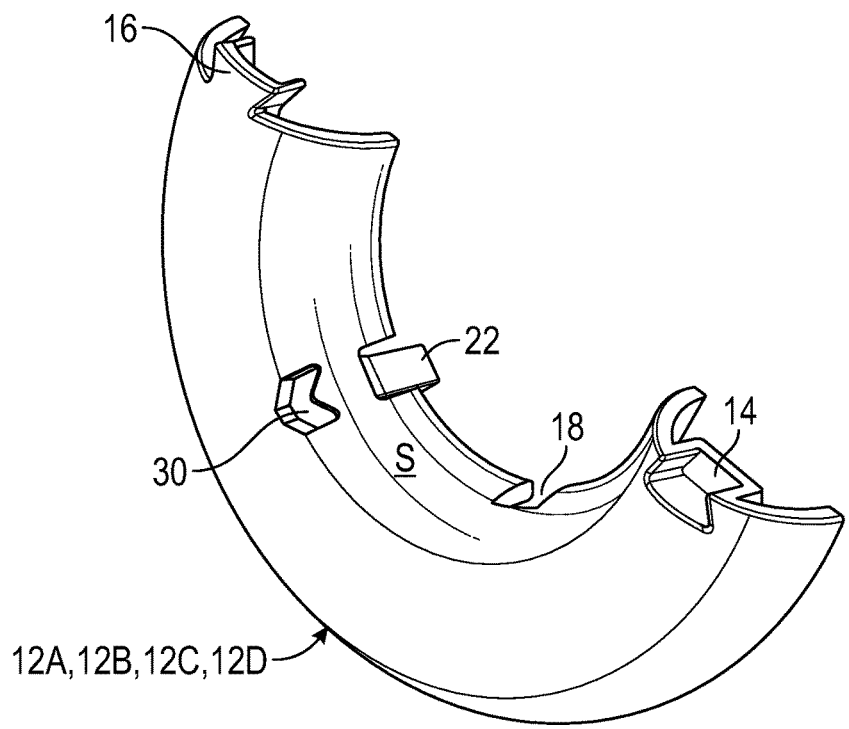
FIG. 2 is a front perspective view of an exemplary guiding member in accordance with embodiments of the present disclosure.
Figure 3:
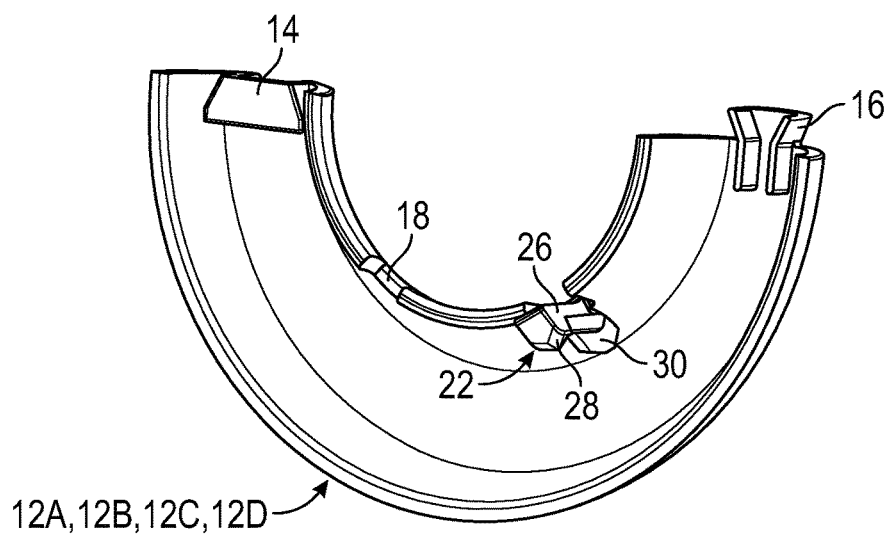
FIG. 3 is a rear view of the guiding member of FIG. 2.

The exemplary embodiments disclosed herein are illustrative of advantageous cable guide assemblies, and systems of the present disclosure and methods/techniques thereof. It should be understood, however, that the disclosed embodiments are merely exemplary of the present disclosure, which may be embodied in various forms. Therefore, details disclosed herein with reference to exemplary cable guides/fabrication methods and associated processes/techniques of assembly and use are not to be interpreted as limiting, but merely as the basis for teaching one skilled in the art how to make and use the advantageous cable guides/systems and/or alternative assemblies of the present disclosure.

In general, the present disclosure provides improved cable guide assemblies, and related methods of use. The present disclosure provides improved cable guide assemblies configured to support media cables, and related methods of use. More particularly, the present disclosure provides advantageous systems/methods for the design and use of cable bundle pass-through guide assemblies configured to support media cables associated with a rack or the like.

Current practice provides that many media cables associated with racks or the like travel between adjacent racks from the front of the racks to the rear of the racks, and such cables may be unsupported and/or insufficiently supported during this travel from the front to the rear of the racks. In exemplary embodiments, the present disclosure provides for improved systems/methods for the design and use of advantageous cable guide assemblies configured to support media cables associated with a rack or the like, thereby providing a significant operational, commercial and/or manufacturing advantage as a result.

Referring now to the drawings, like parts are marked throughout the specification and drawings with the same reference numerals, respectively. Drawing figures are not necessarily to scale and in certain views, parts may have been exaggerated for purposes of clarity.

With reference to FIGS. 1 and 4-6, there is illustrated embodiments of exemplary cable guide assemblies 10A, 10B according to the present disclosure. In general, cable guide assembly 10A, 10B is configured and dimensioned to support media cables 11 or the like (e.g., unshielded twisted pair cables/media, fiber optic cables, etc.). In exemplary embodiments and as discussed further below, cable guide assembly 10A, 10B is configured to support media cables 11 associated with a rack 400 or the like (FIGS. 1, 5, 6 and 9).

It is noted that exemplary cable guide assemblies 10A, 10B are adapted for use in conjunction with a rack 400 (e.g., network or server rack) or the like, although the present disclosure is not limited thereto. Rather, the disclosed cable guide assemblies 10A, 10B are adapted for use in conjunction with other structures, such as, for example, frames, cabinets, patch panels, enclosures, supporting structures, or other structures that stand to benefit from proximate cable management functionality. For ease of disclosure, the potential structures to which the disclosed cable guide assemblies 10A, 10B may be detachably mounted are collective referred to as "rack(s)." However, it is to be understood that the present disclosure is not limited by or to implementations wherein the disclosed cable guide assemblies 10A, 10B are mounted with respect to, or used in conjunction with, a rack, but may be mounted with respect to, or used in conjunction with any structure/unit that is in proximity to or otherwise associated with cable routing.

Figure 9:
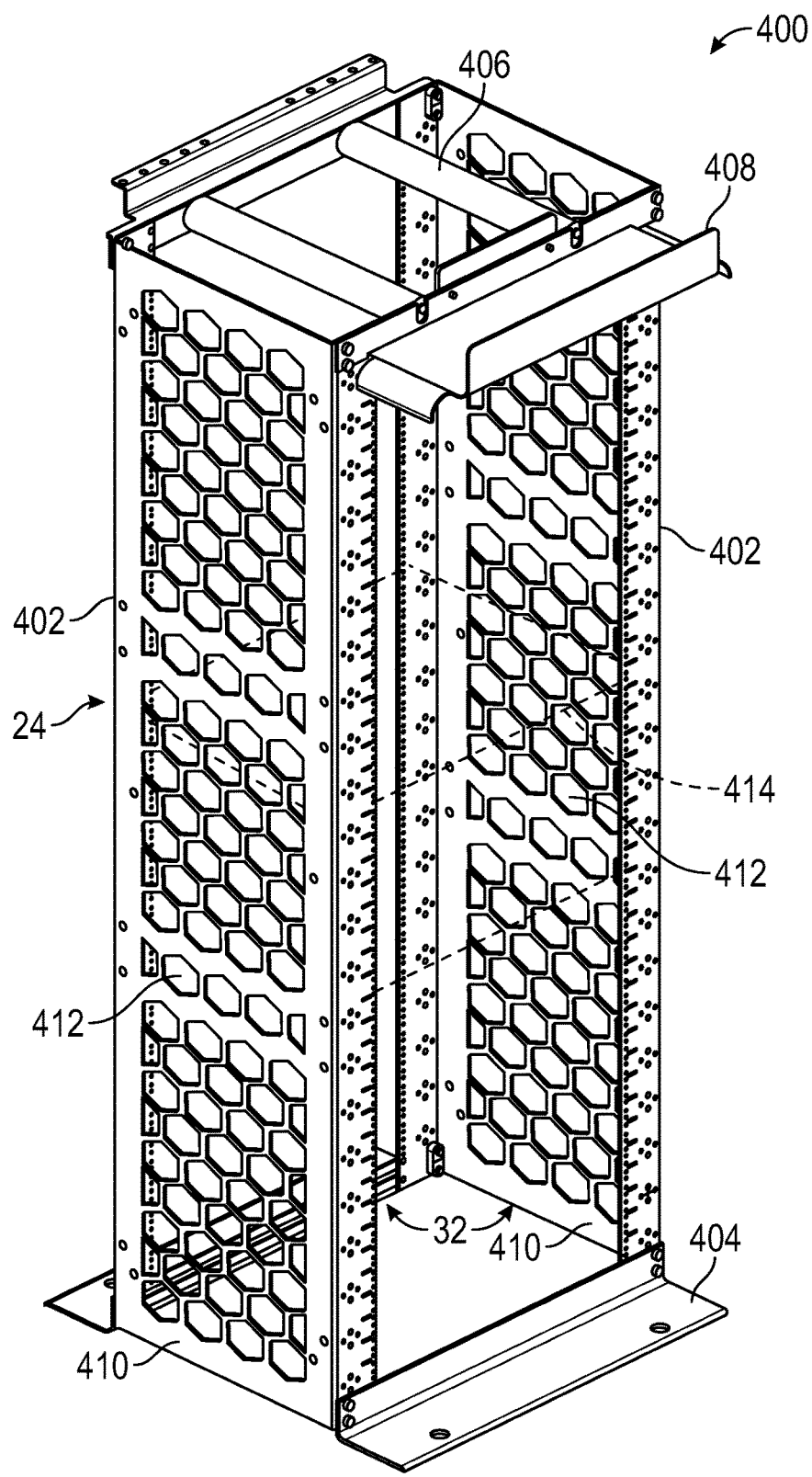
FIG. 9 is a perspective side view of an exemplary rack having ventilated side panels in accordance with embodiments of the present disclosure.

As shown in FIG. 9, an exemplary rack 400 is depicted. In certain embodiments, rack 400 defines a rectangular frame, and can include two or more upright members 402. The upright members 402 can be attached to a base 404 at a bottom margin of the frame. The upright members 402 may further be attached to a top member 406. The top member 406 may include a waterfall 408 for facilitating the formation of appropriately large bend radii in cables mounted with respect to the rack 400.

Each of the upright members 402 may include side panel 410. Each side panel 410 may include a plurality of vent holes/apertures 412 for facilitating the passage of air through the side panel 410. For example, rack 400 is operable as a component of a ventilation system for delivering an improved flow of cooling air to one or more heat generating devices (one of which is shown schematically in FIG. 9 at reference numeral 414) mounted in the rack 400 through the vent holes 412 of a side panel 410, and/or to promote an effective flow of warm exhaust air through the vent holes 412 of a side panel 410.

In exemplary embodiments, the plurality of vent apertures 412 can extend across a predominant portion of the surface area of the side panel 410 to allow the side panel 410 to offer a relatively low level of resistance to the passage of air through the side panel 410 so that the rack 400 is able to deliver an effective flow of cooling air to the device 414 through the vent apertures 412 of a side panel 410, and/or to eliminate an effective flow of exhaust air from the device 414 through the vent apertures 412 of a side panel 410.

As shown in FIG. 9, exemplary vent apertures 412 can take the form of one or more regular or irregular arrays and collectively representing a predominant portion of the total area of the side panel 410 of the respective upright 402. It is noted that other arrangements of vent apertures 412 are possible.

In exemplary embodiments and as shown in FIG. 9, the vent apertures 412 can form one or more honeycomb-type arrays of polygonal (e.g., hexagonal) perforations through the side panel 410. For example, the respective shapes of the array and the individual perforations can be beneficial for purposes of achieving relatively high structural rigidity while simultaneously permitting a relatively high proportion of the area covered by the respective arrays to be open to the unhindered passage through the side panel 410 of respective flows of cooling and/or warm exhaust air with respect to the device 414 mounted therein.

It is noted that other shapes than a honeycomb shape may be provided for the array of vent apertures 412, and/or other shapes than a hexagonal shape may be provided for the vent apertures 412 themselves. For example, the vent apertures 412 may be arranged in an regular array of columns and rows (e.g., vertical columns and horizontal rows), and/or the vent holes themselves may define other shapes (e.g., polygonal shapes such as tetragons, pentagons, heptagons, octagons, etc., and/or regular or irregular shapes, circles, rhombi, etc., or combinations thereof).

Figure 6:
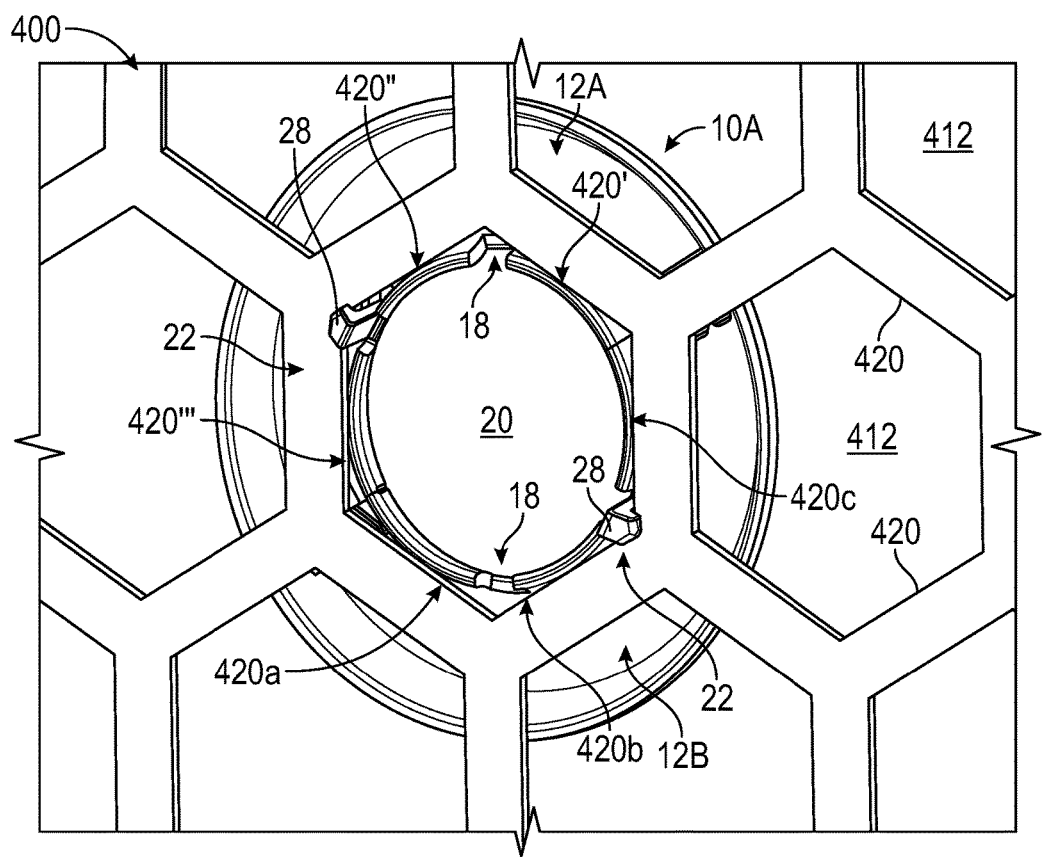
FIG. 6 is a rear view of the first and second guiding members of FIG. 5.

In general, each aperture 412 is defined by edges 420 of side panel 410 (FIG. 6). For example, each fully hexagonally-shaped aperture 412 is defined by six edges 420 of side panel 410 (FIG. 6). It is again noted that apertures 412 can take of variety of shapes (e.g., polygonal shapes) and/or geometries (e.g., circular), and therefore can be defined by a variety of different numbers of edges 420 (e.g., one, two, six, a plurality of edges 420, etc.).

As discussed further below, exemplary cable guide assemblies 10A, 10B of the present disclosure are advantageously configured and dimensioned to be mounted relative to a vent aperture 412 of rack 400 (e.g., for cable management purposes). For example, the exemplary cable guide assemblies 10A, 10B include attachment features/structures (e.g., attachment members 22) that are advantageously configured and dimensioned to releasably mount with respect to edges 420 adjacent to a user-selected aperture 412 of rack 400 (e.g., a user can mount cable guide assembly 10A, 10B relative to one of a variety of different apertures 412 for differing mounting locations of cable guide assembly 10A, 10B to rack 400).

With reference first to cable guide assembly 10A configured to support media cables 11 (FIGS. 4-6) associated with rack 400, exemplary cable guide assembly 10A includes a first guiding member 12A and a second guiding member 12B. In general, first and second guiding members 12A and 12B are substantially mirror images of one another.

Figure 4:
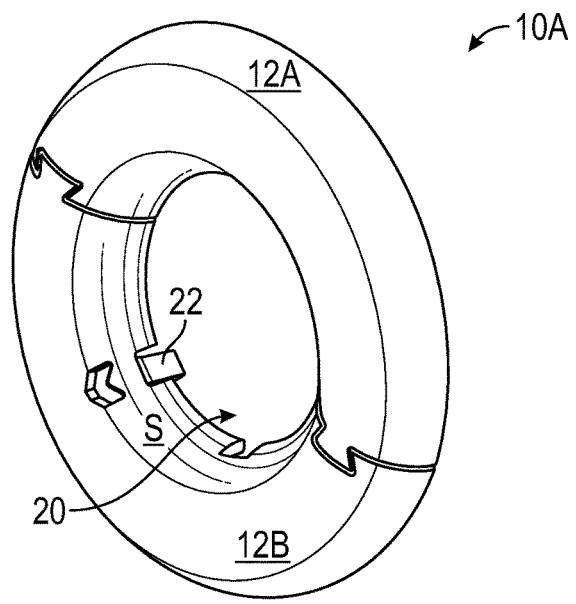
FIG. 4 is a front perspective view of first and second guiding members.
Figure 5:
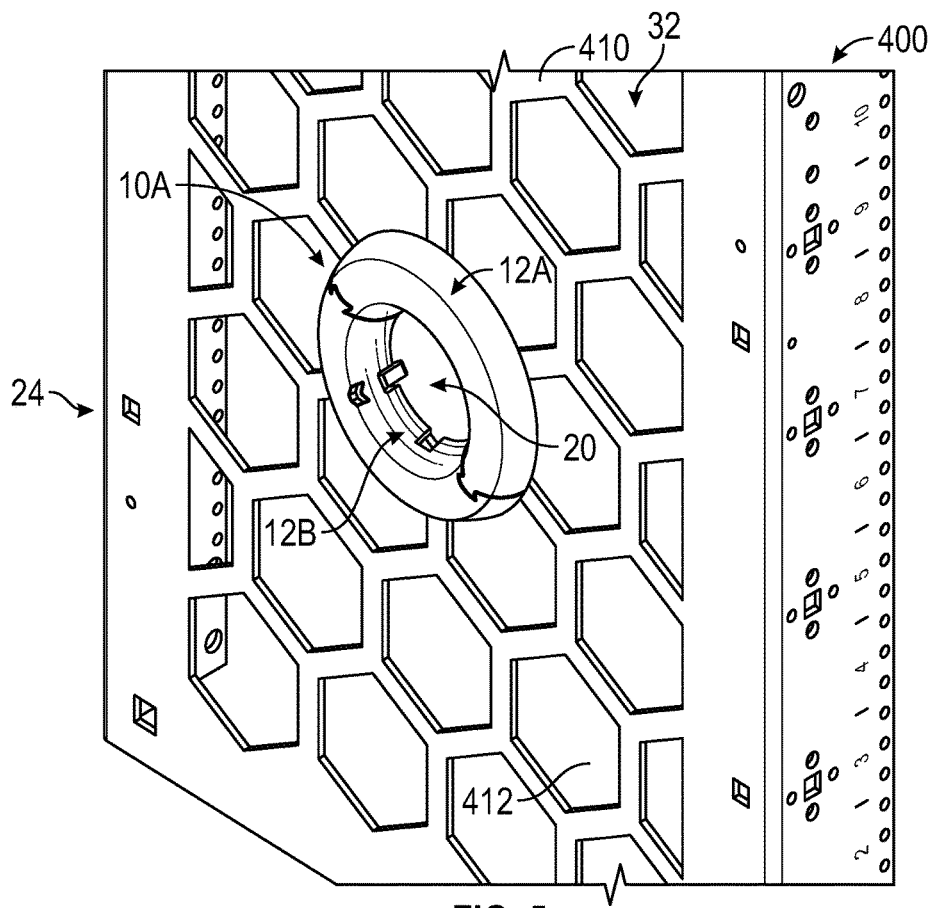
FIG. 5 is a front perspective view of first and second guiding members mounted to a supporting structure.

In exemplary embodiments and as shown in FIGS. 4-6, the first and second guiding members 12A, 12B are configured and dimensioned to be mounted with respect to: (i) each other 12A and 12B, and (ii) a supporting structure 400 (e.g., to edges 420 of rack 400) or the like (e.g., relative to vent holes 412 of a rack).

Figure 7:
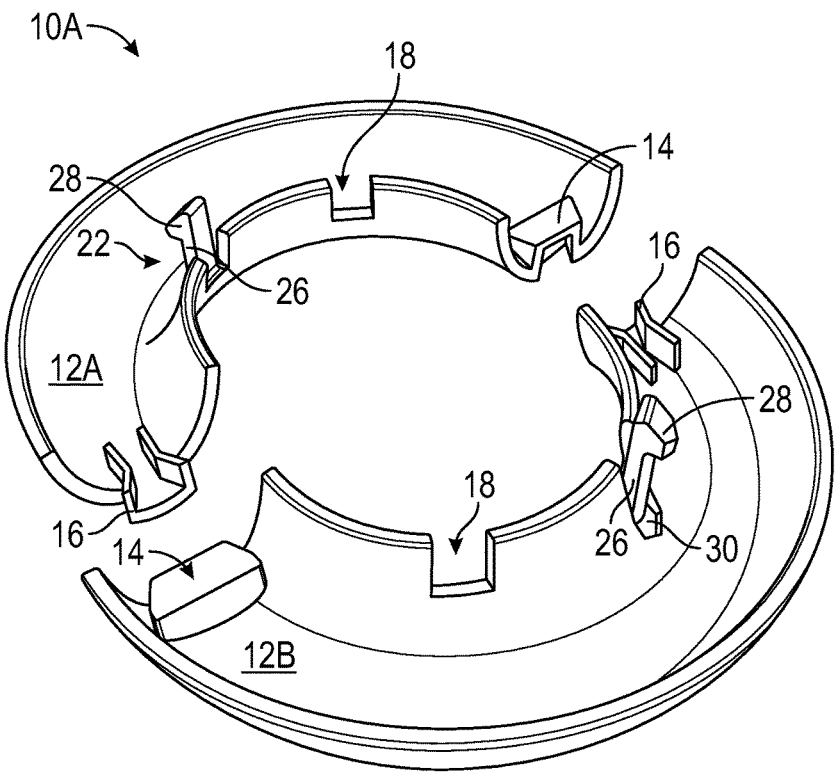
FIGS. 7-8 are rear perspective views of first and second guiding members.
Figure 8:
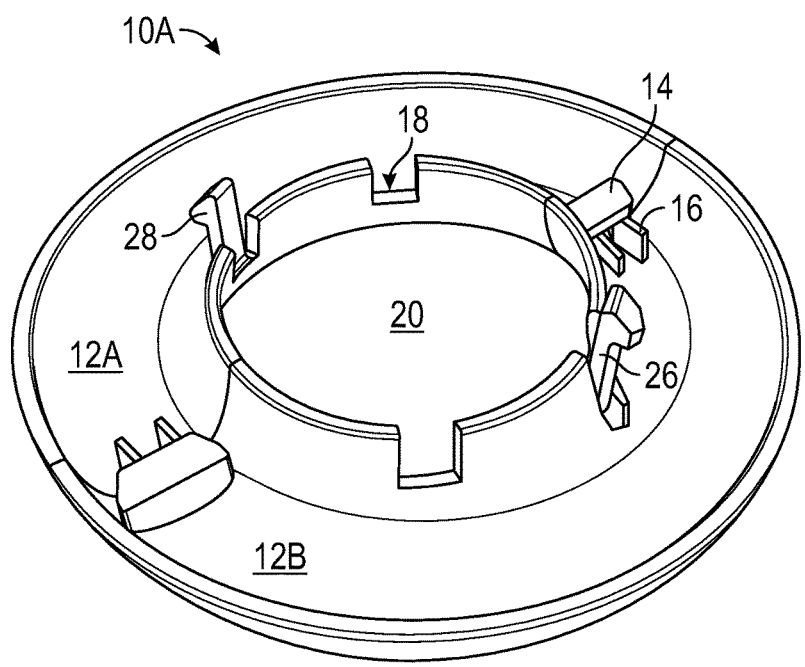

For example, each guiding member 12A, 12B can include a receiving member 14 and a protruding member 16. As such and as shown in FIGS. 7-8, the receiving member 14 of first guiding member 12A is configured to releasably mate with the protruding member 16 of second guiding member 12B (e.g., via an interference or snap-fit engagement), and the receiving member 14 of second guiding member 12B is configured to releasably mate with the protruding member 16 of first guiding member 12A (e.g., via an interference or snap-fit engagement).

Each guiding member 12A, 12B also can include at least one attachment member 22. In general, each attachment member 22 includes an extending portion 26 and a securing portion 28. Securing portion 28 is configured and dimensioned to releasably engage, secure, mount or snap-fit with respect to at least one edge 420 of aperture 412 for securement purposes of cable guide assembly 10A (FIG. 6). In some embodiments and as shown in FIG. 6, each securing portion 28 releasably engages, secures, mounts or snap-fits to two edges 420 of aperture 412 for securement purposes of cable guide assembly 10A (e.g., securing portion 28 of guiding member 12A mounts to edges 420" and 420''' where edges 420" and 420''' meet, as shown in FIG. 6).

Each guiding member 12A, 12B also can include a tooling slot 30 (e.g., for ease of molding/fabrication purposes of 12A, 12B), and a clearance slot 18, the functionality of which is discussed further below.

In general and as shown in FIGS. 1 and 4-6, the mounted first and second guiding members 12A, 12B define a pass-through opening 20 that is bounded (e.g., circularly bounded) or surrounded by a flange-like surface S of members 12A, 12B. In general, surface S is configured and dimensioned to support and/or at least partially house media cables 11 or the like (FIG. 1). As such, exemplary cable guide assembly 10A (or assembly 10B—FIG. 1) includes a smooth (flange-like) surface S providing bend relief for media cables 11 (e.g., fiber or copper cables 11) to pass through a supporting structure 400 (e.g., to pass through an aperture 412 of a panel 410 of an open rack system 400).

As such and in certain embodiments (FIGS. 5-6), the cable guide assembly 10A can include first and second guiding members 12A, 12B that are mounted to one another (12A, 12B), and are mounted against a first side 24 (e.g., exterior side 24) of a panel 410 of an open rack 400 to form a bisected ring-like or ring-shaped structure/assembly 10A, with the attachment members 22 engaging edges 420 of the desired aperture 412. As shown in FIGS. 4-6, the bisected ring structure/shape of assembly 10A is similar to a torus shape (e.g., bagel shape) that has been radially bisected (e.g., cut in half, or half a bagel shape) by a cut running transversely to the central longitudinal axis of the opening 20 (e.g., assembly 10A is shaped like a bagel cut in half).

As such and in certain embodiments, cable guide assembly 10A (FIGS. 4-8) provides a first guiding member 12A having a first receiving member 14, a first protruding member 16, and a first attachment member 22, and provides a second guiding member 12B having a second receiving member 14, a second protruding member 16, and a second attachment member 22. The first and second guiding members 12A, 12B are configured and dimensioned to be mounted with respect to: (i) each other with the first receiving member 14 mating with the second protruding member 16 and the second receiving member 14 mating with the first protruding member 16, and (ii) a supporting structure 400 with the first attachment member 22 releasably securing to edges 420", 420''' of aperture 412 of supporting structure 400, and the second attachment member 22 releasably securing to edges 420b, 420c (FIG. 6). As shown in FIG. 5, the mounted first and second guiding members 12A, 12B form a bisected ring-like or ring-shaped structure 10A having an opening 20 bounded by a flange-like surface S that is configured to support and at least partially house media cables 11. As noted, the bisected ring-like or ring-shaped structure 10A is similar to a torus/bagel shape that has been radially bisected (e.g., cut in half, or half a bagel shape).

In other embodiments and as shown in FIG. 1, the cable guide assembly 10B includes first, second, third and fourth guiding members 12A, 12B, 12C and 12D, and with the first and second guiding members 12A, 12B mounted to one another and against a first side 24 of rack 400, and with the third and fourth guiding members 12C, 12D mounted to one another (e.g., via members 14, 16) and mounted against a second side 32 (e.g., interior side 32) of the rack 400 to form a substantially ring-shaped, ring-like or bagel-shaped cable guide assembly 10B (see also FIGS. 10-11), with the attachment members 22 engaging edges 420 of the desired aperture 412.

Figure 11:
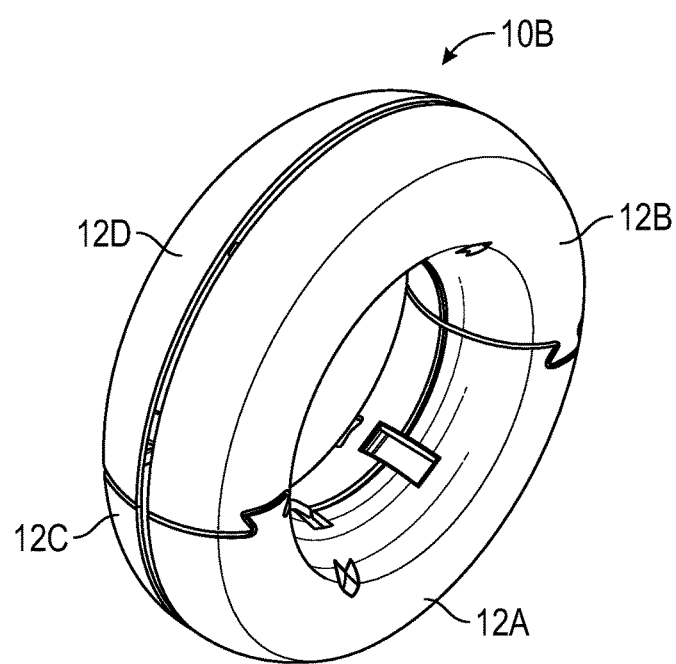

As shown in FIGS. 1 and 11, the assembled ring-shaped, ring-like or bagel-shaped structure/shape of assembly 10B is similar to a torus shape (e.g., bagel shape).

Figure 10:
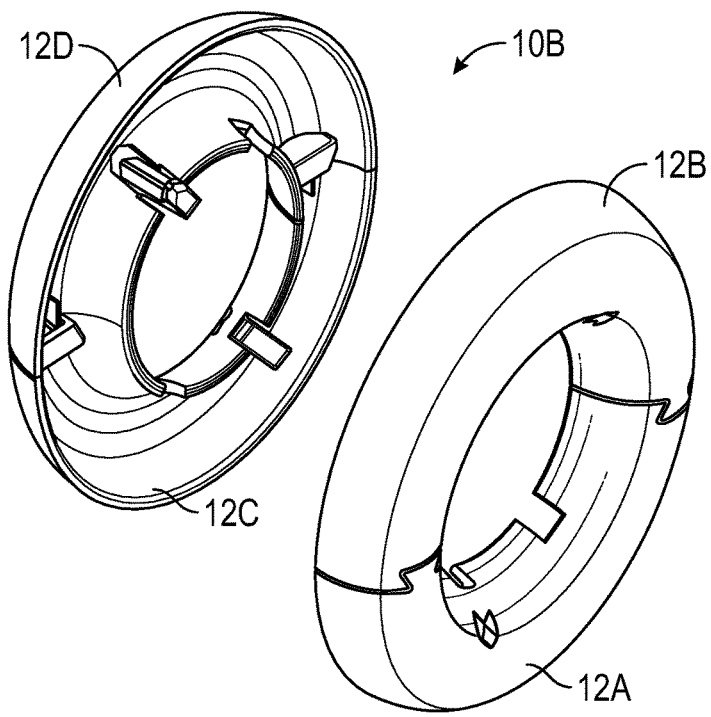
FIGS. 10-11 are front perspective views the cable guide assembly of FIG. 1, with the rack removed for viewing the guiding members.

FIGS. 10 and 11 also depict first, second, third and fourth guiding members 12A, 12B, 12C and 12D forming the ring-shaped, ring-like or bagel-shaped structure/shape of assembly 10B (with rack 400 removed for viewing the guiding members—see also FIG. 1 with rack 400 present).

As shown in FIG. 6, the clearance slots 18 of first and second guiding members 12A, 12B are configured to provide a clearance space for the securing portions 28 of attachment members 22 of third and fourth guiding members 12C, 12D to releasably secure/mount or snap-fit with respect to at least one edge 420 of aperture 412 for securement purposes of cable guide assembly 10B.

For example and as shown in FIG. 6, because of the clearance space provided for by the clearance slot 18 of member 12A, the securing portion 28 of guiding member 12C can mount to edges 420' and 420" where edges 420' and 420" meet. Likewise, because of the clearance space provided for by the clearance slot 18 of member 12B, the securing portion 28 of guiding member 12D can mount to edges 420a and 420b where edges 420a and 420b meet (e.g., to form the assembly 10B as shown in FIG. 1). This is also depicted in FIGS. 10-11, with rack 400 removed for viewing the guiding members.

Likewise, the clearance slots 18 of third and fourth guiding members 12C, 12D are configured to provide a clearance space for the securing portions 28 of attachment members 22 of first and second guiding members 12A, 12B to releasably secure/mount or snap-fit with respect to at least one edge 420 of aperture 412 for securement purposes of cable guide assembly 10B (FIG. 1).

For example, because of the clearance space provided for by the clearance slot 18 of member 12C, the securing portion 28 of guiding member 12A can mount to edges 420" and 420'" where edges 420" and 420'" meet. Likewise, because of the clearance space provided for by the clearance slot 18 of member 12D, the securing portion 28 of guiding member 12B can mount to edges 420b and 420c where edges 420b and 420c meet (e.g., to form the assembly 10B as shown in FIG. 1). This is also depicted in FIGS. 10-11, with rack 400 removed for viewing the guiding members.

Thus, first and second guiding members 12A, 12B are configured to mount independently to the first 24 (or second 32) side of an open rack 400 (e.g., by mechanically snapping directly to edges 420 of a geometric shaped aperture 412 in a sidewall 410), and the third and fourth guiding members 12C, 12D are configured to mount independently to the second 32 (or first 24) side of rack 400 (e.g., by mechanically snapping directly to edges 420 of a geometric shaped aperture 412 in a sidewall 410). The advantageous cable guide assemblies 10A, 10B can therefore provide for multiple mounting options around the sidewall 410/cutout 412 depending on the desired mounting structure (e.g., utilizing first and second guiding members 12A, 12B to provide a bisected ring-like structure/assembly 10A; or utilizing first, second, third and fourth guiding members 12A, 12B, 12C, 12D to provide a substantially ring-like or bagel-shaped cable guide assembly 10B. Any number of assemblies 10A and/or 10B can be positioned or mounted on rack 400, as desired.

In exemplary embodiments, cable guide assembly 10A, 10B is fabricated from plastic or a polymeric material or the like, although the present disclosure is not limited thereto. Rather, it is noted that cable guide assembly 10A, 10B can be fabricated from a variety of materials, and can take a variety of shapes, forms or geometries.

Attachment members 22 are advantageously configured and dimensioned to releasably mount to rack 400 relative to a user-selected aperture 412 of rack 400 (e.g., a user can mount cable guide assembly 10A, 10B relative to one of a variety of different apertures 412 for differing mounting locations of cable guide assembly 10A, 10B to rack 400). It is noted that cable guide assembly 10A can be mounted with respect to the exterior surface 24, or to the interior surface 32 of side panel 410 of rack 400.

It is also noted that a plurality of cable guide assemblies 10A and/or 10B can be mounted with respect to side panel 410 of rack 400, with each cable guide assembly 10A, 10B mounted at differing mounting locations on rack 400 (e.g., to different apertures 412).

In certain embodiments, one or more cable guide assemblies 10A, 10B are mounted with respect to side panel 410 of rack 400, and media cables 11 from a cable/wire manager assembly or the like (e.g., a vertical cable manager assembly positioned between two adjacent/proximal racks 400) travel from the cable/wire manager assembly to the one or more cable guide assemblies 10A, 10B for cable management purposes (e.g., to advantageously provide support for media cables 11 during their travel from the front to the rear of the racks 400, and/or between adjacent racks 400). It is noted that media cables 11 can pass through hole/opening 20 of cable guide assemblies 10A, 10B for cable management/support purposes. Additionally, it is noted that mounted cable guide assemblies 10A, 10B to rack 400 do not impede the flow of air (e.g., cooling or exhaust air) through side panels 410 of rack (e.g., via air flowing thorough hole/opening 20). It certain embodiments, the shape of hole/opening 20 substantially matches up with and aligns with aperture 412 when assembly 10A, 10B is mounted to that particular aperture 412.

In certain embodiments, it is noted that each guiding member 12A, 12B, 12C and 12D is substantially half-circular in shape/form (e.g., the members 12A, 12B, 12C and 12D are each substantially arc-like in shape, with each curving about 180° around the opening 20 to form the ring-shaped structure), although the present disclosure is not limited thereto. Rather and as discussed further below, it is noted that assembly 10A and/or 10B can include any suitable number of guiding members 12 (e.g., one, two, three, four, a plurality, etc.—see FIGS. 12-13).

Figure 12:
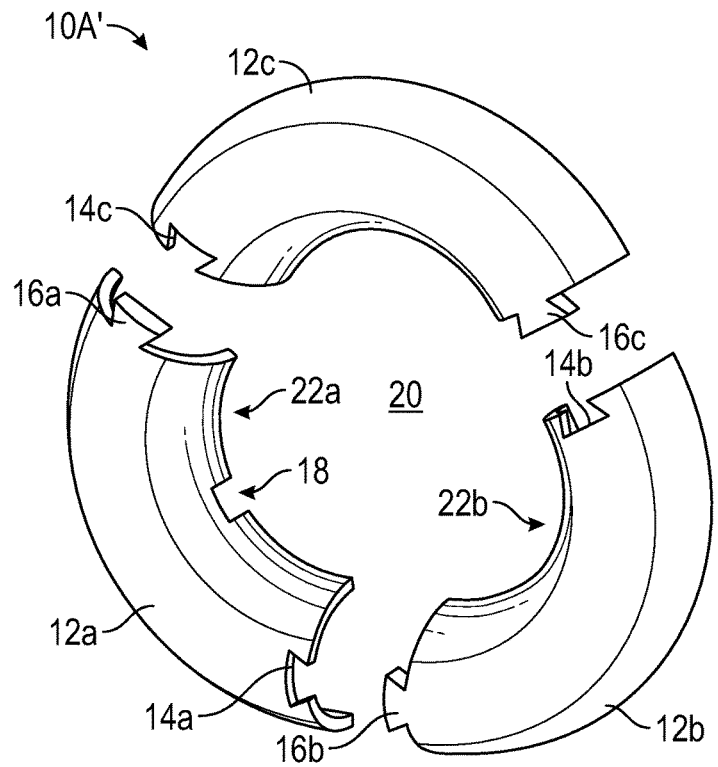
FIGS. 12-13 are front perspective views of other exemplary guiding members.
Figure 13:
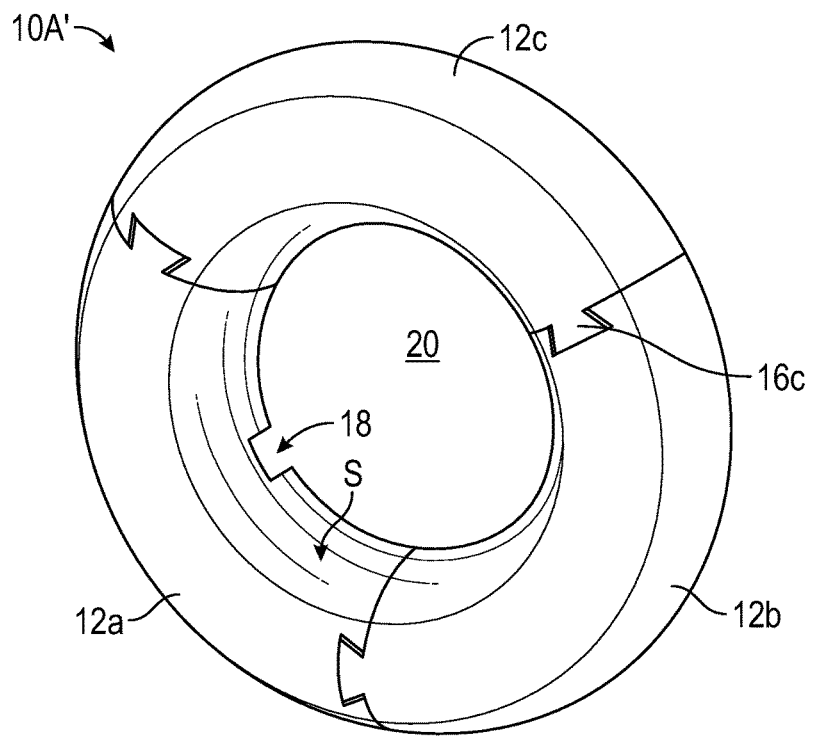

For example and as shown in FIGS. 12-13, instead of assembly 10A including two half-circular guiding members (e.g., 12A and 12B), assembly 10A' could include three guiding members 12a, 12b and 12c, with each guiding member extending/arcing about 120° in a curved fashion or manner. Stated another way, guiding members 12a, 12b and 12c are each substantially arc-like in shape, and each curve about 120° around the opening 20 to form the bisected ring-shaped structure 10A' (FIG. 13) (it is further noted that assembly 10A could include four guiding members, with each guiding member extending/arcing about 90° in a curved fashion or manner).

Thus and as depicted in FIGS. 12-13, cable guide assembly 10A' includes a first guiding member 12a having a first receiving member 14a, a first protruding member 16a, and a first attachment member 22a; a second guiding member 12b having a second receiving member 14b, a second protruding member 16b, and a second attachment member 22b; and a third guiding member 12c having a third receiving member 14c and a third protruding member 16c.

Similar to members 12A and 12B, the first, second and third guiding members 12a, 12b, 12c are configured and dimensioned to be mounted with respect to: (i) each other with the first receiving member 14a mating with the second protruding member 16b and the second receiving member 14b mating with the third protruding member 16c and with the third receiving member 14c mating with the first protruding member 16a, and (ii) a supporting structure 400 with the first attachment member 22a releasably securing to a first edge 420 of an aperture 412 of the supporting structure 400 and the second attachment member 22b releasably securing to a second edge 420 of the aperture 412.

As such and similar to assembly 10A, the mounted first, second and third guiding members 12a, 12b, 12c form a bisected ring-shaped structure 10A' (FIG. 13) having an opening 20 bounded by a flange-like or flange-shaped surface S that is configured to support and at least partially house media cables 11.

Similar to assembly 10B, it is noted that assembly 10A' can also include the other half of structure 10A' to form a structure similar to assembly 10B (e.g., it could include three more guiding members like 12a, 12b, 12c to form the other half of the torus or bagel shaped structure as similarly shown in FIGS. 1 and 11).

Figure 14:
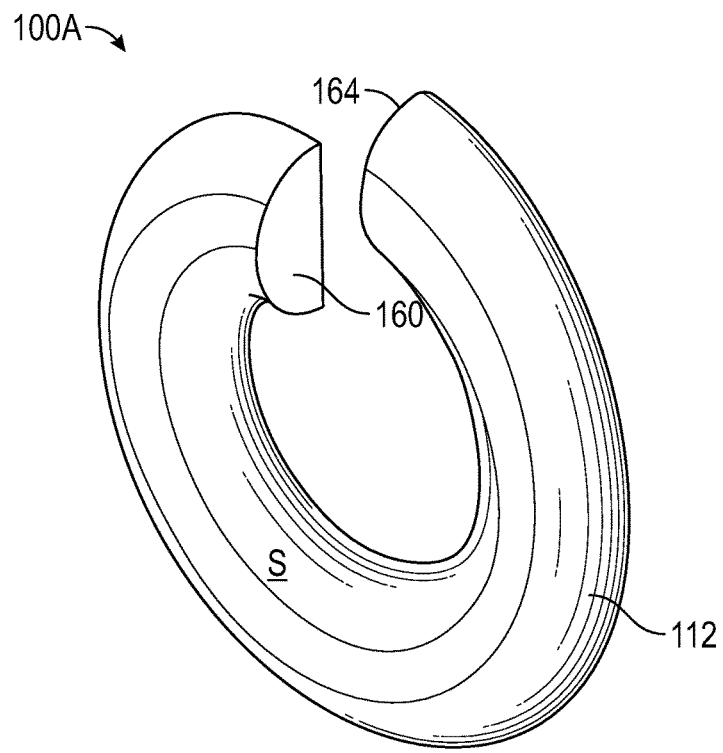
FIGS. 14-15 are front perspective views of another exemplary guiding member.
Figure 15:
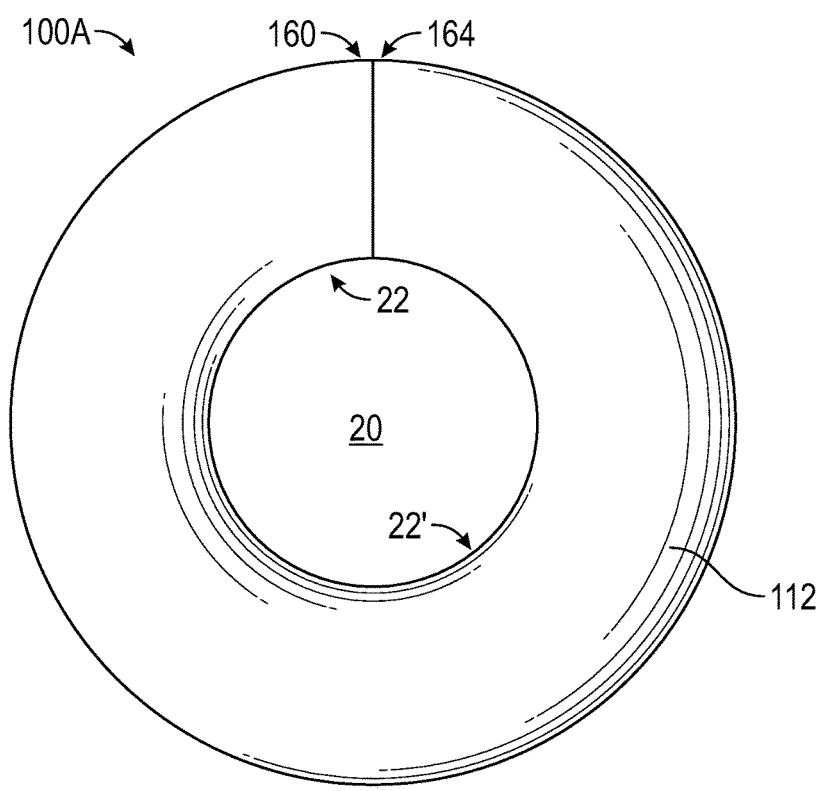

In other embodiments and as shown in FIGS. 14-15, instead of assembly 10A including two half-circular guiding members (e.g., 12A and 12B), assembly 100A could include one guiding member 112, with guiding member 112 extending/arcing about 360° in a curved fashion or manner around opening 20 to form the bisected ring-shaped structure 100A (FIG. 15).

Thus and as depicted in FIGS. 14-15, cable guide assembly 100A includes a guiding member 112 having first attachment member 22 and a second attachment member 22', with the guiding member 112 configured and dimensioned to be mounted with respect to a supporting structure 400 with the first attachment member 22 releasably securing to a first edge 420 of an aperture 412 of the supporting structure 400, and with the second attachment member 22' releasably securing to a second edge 420 of the aperture 412 of the supporting structure 400.

As such and similar to assembly 10A, the mounted guiding member 112 forms a bisected ring-shaped structure 100A having an opening 20 bounded by a flange-shaped surface S that is configured to support and at least partially house media cables 11.

Similar to assembly 10B, it is noted that assembly 100A can also include the other half of structure 100A to form a structure similar to assembly 10B (e.g., it could include one more guiding member 112 to form the other half of the torus or bagel shaped structure as similarly shown in FIGS. 1 and 11).

As shown in FIGS. 14-15, guiding member 112 extends (e.g., in a circular fashion) from a first end 160 to a second end 164. In exemplary embodiments, ends 160, 164 are movable and/or flexible relative to one another (FIG. 14), thereby advantageously allowing a user to flex or move end 160 and/or 164 to ease/facilitate the process of mounting the member 112 onto rack 400 or the like. For example, when mounting the first attachment member 22 of member 112 onto rack 400, a user may move or flex end 160 and/or 164 to a first position (e.g., FIG. 14) while the user first mounts member 22 to rack 400, and then move or flex end 160 and/or 164 to a second position (e.g., FIG. 15) after/while the user mounts second member 22' to rack 400.

Although the systems and methods of the present disclosure have been described with reference to exemplary embodiments thereof, the present disclosure is not limited to such exemplary embodiments and/or implementations. Rather, the systems and methods of the present disclosure are susceptible to many implementations and applications, as will be readily apparent to persons skilled in the art from the disclosure hereof. The present disclosure expressly encompasses such modifications, enhancements and/or variations of the disclosed embodiments. Since many changes could be made in the above construction and many widely different embodiments of this disclosure could be made without departing from the scope thereof, it is intended that all matter contained in the drawings and specification shall be interpreted as illustrative and not in a limiting sense. Additional modifications, changes, and substitutions are intended in the foregoing disclosure. Accordingly, it is appropriate that the appended claims be construed broadly and in a manner consistent with the scope of the disclosure.

What is claimed is:

1. A cable guide assembly comprising:
a first guiding member having a first receiving member, a first protruding member, and a first attachment member, the first attachment member including an extending portion and a securing portion, the extending portion extends away from a back surface of the first guiding member, and the securing portion extends away from the extending portion with the securing portion positioned a distance away from the back surface of the first guiding member;
a second guiding member having a second receiving member, a second protruding member, and a second attachment member, the second attachment member including an extending portion and a securing portion, the extending portion extends away from a back surface of the second guiding member, and the securing portion extends away from the extending portion with the securing portion positioned a distance away from the back surface of the second guiding member;
wherein the first and second guiding members are configured and dimensioned to be mounted with respect to: (i) each other with the first receiving member mating with the second protruding member and the second receiving member mating with the first protruding member, and (ii) a supporting structure with the securing portion of the first attachment member releasably securing to a first edge and a second edge of an aperture of the supporting structure and the securing portion of the second attachment member releasably securing to a third edge and a fourth edge of the aperture;
wherein the first and second edges are adjacent to one another, and the third and fourth edges are adjacent to one another;
wherein the mounted first and second guiding members form a bisected torus-shaped structure having an opening bounded by a surface that is configured to support and at least partially house media cables.

2. The assembly of claim 1, wherein the supporting structure is a rack, and wherein the aperture of the supporting structure has a substantially polygonal shape.

3. The assembly of claim 1, wherein the first and second guiding members are each substantially half-circular in shape.

4. The assembly of claim 1, wherein the first and second guiding members are each substantially arc-like in shape, and each curve about 180° around the opening to form the bisected torus-shaped structure.

5. The assembly of claim 1, wherein the aperture of the supporting structure has a substantially hexagonal shape.

6. The assembly of claim 1, wherein the first edge is not adjacent to the third or fourth edges, and the second edge is not adjacent to the third or fourth edges.

* * * * *